United States Patent [19]

Shimoda et al.

[11] Patent Number: 4,894,611
[45] Date of Patent: Jan. 16, 1990

[54] SYSTEM FOR MEASURING CHARACTERISTICS OF ELECTRON EMITTING SOURCES

[75] Inventors: Isamu Shimoda, Zama; Mamoru Miyawaki, Tokyo; Akira Suzuki; Tetsuya Kaneko, both of Yokohama; Takeo Tsukamoto, Atsugi; Toshihiko Takeda; Masahiko Okunuki, both of Tokyo, all of Japan

[73] Assignee: Canon Kabushiki Kaisha, Tokyo, Japan

[21] Appl. No.: 186,963

[22] Filed: Apr. 27, 1988

[30] Foreign Application Priority Data

Apr. 28, 1987 [JP] Japan ............................. 62-103023

[51] Int. Cl.⁴ ..................... G01R 29/00; G01R 31/26
[52] U.S. Cl. ........................... 324/158 R; 324/158 D; 324/411
[58] Field of Search ............. 324/158 R, 158 D, 409, 324/410, 411, 412, 575 S, 71.3; 342/388

[56] References Cited

U.S. PATENT DOCUMENTS

| | | | |
|---|---|---|---|
| 1,406,996 | 2/1922 | Morrill | 342/388 |
| 2,782,366 | 2/1957 | Wall | 324/410 |
| 3,324,395 | 6/1967 | Springer | 324/158 D |
| 4,259,678 | 3/1981 | van Gorkom et al. | 357/13 |
| 4,325,084 | 4/1982 | van Gorkom et al. | 358/241 |

FOREIGN PATENT DOCUMENTS 54-111272 8/1979 Japan .

Primary Examiner—Ernest F. Karlsen
Attorney, Agent, or Firm—Fitzpatrick, Cella, Harper & Scinto

[57] ABSTRACT

A measuring system particularly suitably usable with an apparatus having a plurality of electron emitting sources, for measuring the characteristics of the electron emitting sources is disclosed. In the measuring system, the electron emitting sources are driven so that they emit electron flows of predetermined and different frequencies. The emitted electron flows are collected and, thereafter, only those signals having components corresponding to the predetermined frequencies are extracted. Based on the extracted signals, the characteristics of the electron emitting sources are measured at the same time and independently of each other.

8 Claims, 3 Drawing Sheets

SYSTEM FOR MEASURING CHARACTERISTICS OF ELECTRON EMITTING SOURCES

FIELD OF THE INVENTION AND RELATED ART

This invention relates to a measuring system, suitably usable with an apparatus having a plurality of electron emitting sources such as a multi-electron-beam pattern drawing apparatus, a display device or otherwise, for measuring characteristics of the electron emitting sources.

Conventional electron emitting sources utilize emission of thermoelectrons from a hot cathode. However, these types of electron emitting sources involve problems of a large loss in energy due to the heating, the necessity of provision of heating means, and so on. In consideration of such inconveniences, studies have been made to develop an electron emitting source that does not rely on heating, and various proposals and reports have been made. Examples of such an electron emitting source are as follows:

(1) An electron emitting element of the type that an inverse bias voltage is applied to a p-n junction to cause avalanche breakdown whereby electrons are emitted out of the element. This type of electron emitting element is disclosed in U.S. Pat. No. 4,259,678 and Japanese Laid-Open patent application, Laid-Open No. Sho54-111272.

(2) An MIM type electron emitting element wherein a layered structure of metal-insulator-metal is provided and wherein an electric voltage is applied between two metal layers, whereby electrons passed through the insulating layer due to the tunnel effect are emitted from the metal layer to the outside of the element.

(3) A surface conduction type electron emitting element wherein an electric voltage is applied to a high-resistance thin film in a direction perpendicular to the film direction, whereby electrons are emitted from the surface of the thin film to the outside of the element.

(4) A field-effect type (FE type) electron emitting element wherein an electric voltage is applied to a metal member having such shape that easily causes the electric field concentration, so that a high-density electric field is produced locally whereby electrons are emitted from the metal member to the outside of the element.

In the field of manufacture of semiconductor microcircuits, it has been considered to use a plurality of electron emitting sources of any one of the types described above to provide a multi-electron-beam pattern drawing apparatus. Also, in the field of display devices, it has been considered to use a plurality of electron emitting sources, in combination, to provide a display device.

SUMMARY OF THE INVENTION

Where plural electron emitting sources are used in an apparatus as a radiation energy source means, it is desirable to measure or examine the electron emission characteristics (response characteristic) of each electron emitting source. However, there has not been developed or proposed such a measuring apparatus that allows measurement of the characteristics of each electron emitting source, particularly, the measurement of the same during the operation of the electron emitting source. This causes inconveniences such as follows:

Where plural electron emitting sources are used in a display device, the state of operation of each emitting source may be examined by manual observation (naked-eye observation) or otherwise. However, in a case where plural electron emitting sources are used as a radiation energy source means in a semiconductor device manufacturing exposure apparatus, it is very difficult to detect accidental disorder or otherwise of each electron emitting source. While such a disorder or malfunction may be revealed in the course of the process of product inspection, it is too late.

The present invention has been made to avoid such inconveniences described above. Accordingly, it is an object of the present invention to provide a measuring system for measuring an emitted electric current from an electron emitting source means, more particularly a measuring system capable of measuring emitted electric currents of an electron emitting source means having a plurality of electron emitting portions, to thereby allow measurement of the characteristics of the electron emitting source means.

It is another object of the present invention to provide a measuring device capable of measuring the characteristics of electron emitting source means even during operation of the same.

Briefly, according to one aspect of the present invention, there is provided a measuring system for measuring the response characteristics of electron emitting source means, wherein the electron emitting source means is driven so that an electron flow of a predetermined frequency is emitted; the emitted electron flow is collected; only a signal of said predetermined frequency component is extracted out of the collected electron flow; and, on the basis of this, the characteristics of the electron emitting source means is displayed or outputted.

The present invention described above is particularly suitably applicable to an apparatus having a plurality of electron emitting portions. In such a case, according to the present invention, electron flows are produced from the electron emitting portions at different frequencies, and signal components each corresponding to one of the different frequencies are extracted. By this, the characteristics of each electron emitting portion can be measured discriminatingly.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
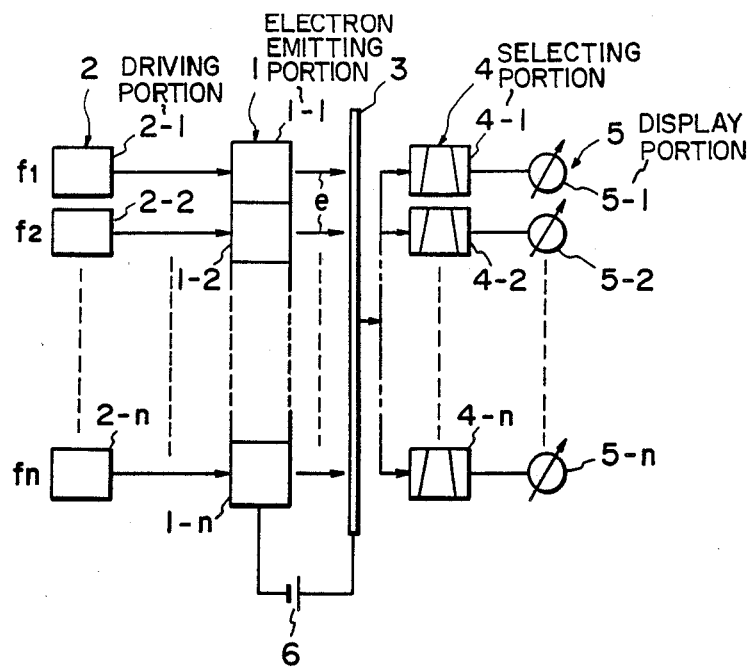
FIG. 1 is a schematic and diagrammatic view showing the general structure of a measuring system according to an embodiment of the present invention, wherein the measuring system is used with a radiation energy source means having a plurality of electron emitting portions.

FIG. 1 shows the general structure of a measuring apparatus according to one embodiment of the present invention, wherein the measuring system is used with an electron emitting source means having plural electron emitting portions.

As shown in FIG. 1, the electron emitting device which is the subject of examination is generally denoted at a reference numeral 1 and includes a plurality of electron emitting portions 1-1, 1-2, ..., and 1-n. Driving device 2 is provided to drive the electron emitting device 1 and includes a plurality of oscillators (of a number "n") corresponding to the electron emitting portions 1-1, 1-2, ..., and 1-n and having oscillation frequencies f1, f2, ..., and fn. The measuring system further includes a collecting device for collecting electrons emitted from the electron emitting device 1. Thus, substantially all the electrons, denoted at e in FIG. 1 and emitted from the electron emitting portions 1-1, 1-2, ..., and 1-n, are collected by the common collecting device 3. In a case where the electron emitting device is used in a semiconductor wafer exposing electron beam apparatus, the collecting device 3 may comprise an electrode which is provided at a contact portion of a wafer holding chuck, adapted to contact a wafer, so that it electrically contacts a wafer as held by the wafer chuck. In such a case, the electrode can operate to collect, by way of the wafer, such electrons as having been emitted from the electron emitting portions and being projected upon the wafer. With this arrangement, the characteristics of each electron emitting portion can be monitored, with the arrangement described hereinafter, even during a time period during which the electron emitting portions operate for exposure of a wafer.

High-voltage source 6 is provided to produce an electric field between the surface of the electron emitting device 1 and the collecting device 3 so as to accelerate the electrons e. While such acceleration voltage differs, depending on the end of use or the distance between the electron emitting device 1 and the collecting device 3, usually it is set at a value between several hundreds volts and several kilovolts. The measuring system further includes a selecting device for separating and selecting those signals, out of the electrons e collected by the collecting device 3, each corresponding to an electron flow as emitted from an associated one of the electron emitting portions 1-1, 1-2, ... and 1-n. The selecting device 4 comprises a plurality of selecting portions 4-1, 4-2, ... 4-n having different selection frequencies. The frequency characteristics of each of the selecting portions 4-1, 4-2, ... and 4-n is so set that only an oscillation frequency component of a corresponding one of the oscillators 2-1, 2-2, ... and 2-n of the driving device 2 is selectively transmitted. Denoted generally at a reference numeral 5 is a display device, having plural display portions 5-1, 5-2, ... and 5-n, which is provided to display the outputs of the selecting device 4.

In operation of the described structure, the driving device 2 having the oscillators of different oscillation frequencies f1, f2, ... and fn operates to drive the electron emitting portions 1-1, 1-2 ... and 1-n of the electron emitting device 1, such that electron flows of frequencies f1, f2, ... and fn are discharged from the electron emitting portions, respectively. These electron flows are collected by the collecting device 3. Subsequently, by means of the selecting portions 4-1, 4-2, ... and 4-n of the selecting device, electric currents corresponding to the aforesaid oscillation frequencies, respectively, are selected independently of each other. The output of each selecting portion is displayed by a corresponding one of the display portions of the display device 5. By this, the electron emission states (response characteristics) of the electron emitting portions 1-1, 1-2, ... and 1-n can be measured simultaneously and independently of each other. In this case, the collecting device 3 is a common means for the different electron emitting portions 1-1, 1-2, ... and 1-n. Therefore, any effect of the collecting device 3 upon the measured values can be disregarded.

Figure 2:
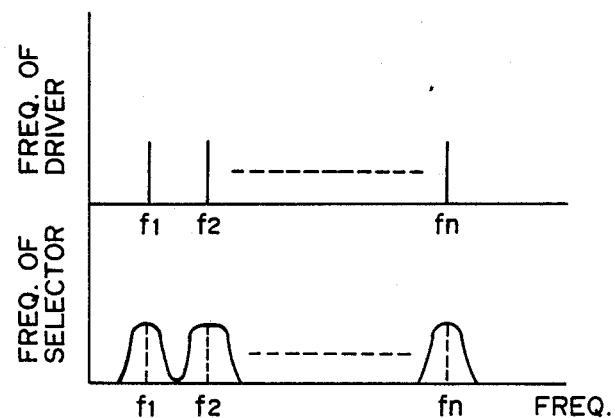
FIG. 2 is a graph showing oscillation frequencies of oscillators used in the system of FIG. 1, in relation to the frequency characteristics of a selecting means also used in the system of FIG. 1.

FIG. 2 is a graph showing the relation between the oscillation frequencies f1, f2, ... and fn of the oscillators 2-1, 2-2, ... and 2-n of the driving device 2 and the frequency characteristics of the selecting portions 4-1, 4-2, ... and 4-n of the selecting device 4. As seen in FIG. 2, the frequencies f1, f2, ... and fn determined by the oscillators of the driving device 2 differ from each other. Thus, it is necessary that the selecting portions 4-1, 4-2, ... and 4-n corresponding to the oscillators 2-1, 2-2, ... and 2-n have appropriately set mutual frequency differences for allowing separation and selection by the selecting portions.

In order to avoid an error which might be caused by non-linear distortion in each portion, it is desirable that the frequencies f1, f2, ... and fn are so set that they are not in the relation of multiple. From the viewpoint of practicability, the frequencies f1, f2, ... and fn are preferably in the range of audio frequencies, namely in a range from several hundreds Hz to several tens KHz. This is preferable for ease in the manufacture. Further, it is desirable that the selecting device 4 has flat or even transmission band characteristics in order to avoid that any change in the oscillation frequencies f1, f2 ... and fn does not have an effect upon the measured values.

Figure 3:
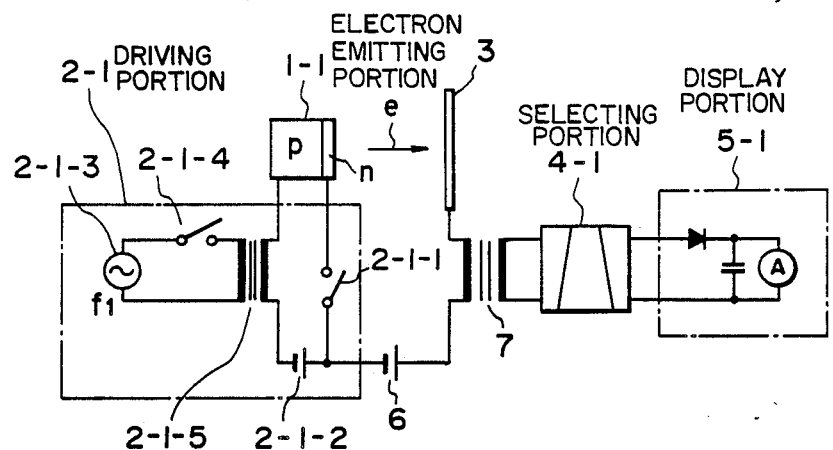
FIG. 3 is a circuit diagram showing, in greater detail, a portion of the combined structure of an electron emitting portion, a driving means, a selecting means and a display means used in the system of FIG. 1.

FIG. 3 is a circuit diagram showing, in greater detail, the electron emitting portion 1-1, the driving portion 2-1, the selecting portion 4-1 and the display portion 5-1, all included in the structure shown in FIG. 1.

In the arrangement shown in FIG. 3, the electron emitting portion 1-1 comprises an avalanche type electron emitting portion having a p-n structure, and is adapted to emit electrons e from the surface of an n-type layer to which an inverse bias voltage is applied. Denoted at 2-1-1 is a switch for controlling a driving electric current for the electron emitting portion 1-1. Namely, when the switch 2-1-1 is turned on, electrons e are emitted from the surface of the electron emitting portion 1-1, the emitted electrons being collected by the collecting device 3. When the switch 2-1-1 is turned off, no electron is emitted. Low voltage source 2-1-2 is effective to determine the operating point of the electron emitting portion 1-1. Usually, an electric voltage of an order of 10–100 V is set. Oscillator 2-1-3 is a source of oscillation which oscillates at a frequency f1. The amplitude and the frequency of the oscillator is variable so that optimum values may be set. Switch 2-1-4 is a selection switch which is operable to selectively apply the output of the oscillator 2-1-3 to the electron emitting portion 1-1. In order to allow measurement by use of the measuring system of the present embodiment, the switch 2-1-4 has to be turned on. Input transformer 2-1-5 is operable to superpose the output of the oscillator 2-1-3 upon the low voltage source 2-1-2, and it is desirable that a DC resistance of winding connected to the low voltage source 2-1-2 is sufficiently low as compared with the electron emitting portion 1-1. Output transformer 7 is operable to extract frequency components (f1, f2, ... and fn) out of the electron flows as collected by the collecting device 3.

Figure 4:
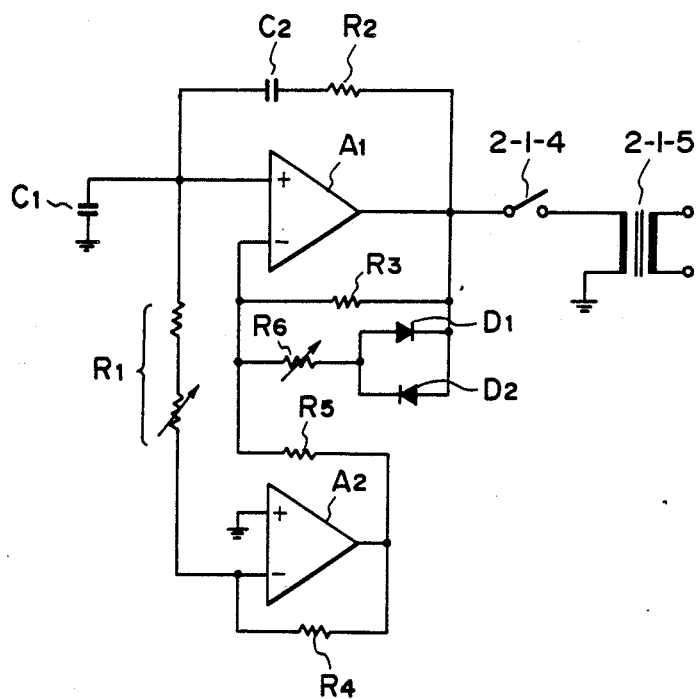
FIG. 4 is a circuit diagram exemplifying an oscillator usable in the system of FIG. 1.

FIG. 4 is a circuit diagram exemplifying the structure of the oscillator 2-1-3. As shown in this figure, there are provided operational amplifiers A1 and A2; diodes D1 and D2; resistors R1, R2, R3, R4, R5 and R6; and capacitors C1 and C2. Each of the resistors R1 and R6 is of a variable resistance type, allowing adjustment of the frequency and the amplitude. In the circuit configuration illustrated, the oscillation frequency f may be determined in accordance with the following equation:

$$f = 1/(2\pi \sqrt{R_1 R_2 C_1 C_2})$$

If, for example, R1 = R2 = 10 KΩ, and C1 = C2 = 0.01 μF, then f ≈ 1.59 KHz.

Designs of such a circuit usable in the present invention are described, in detail, in Chapter 21 of "Hand Book of Operational Amplifier Circuit Design", 1973, McGraw-Hill.

Figure 5:
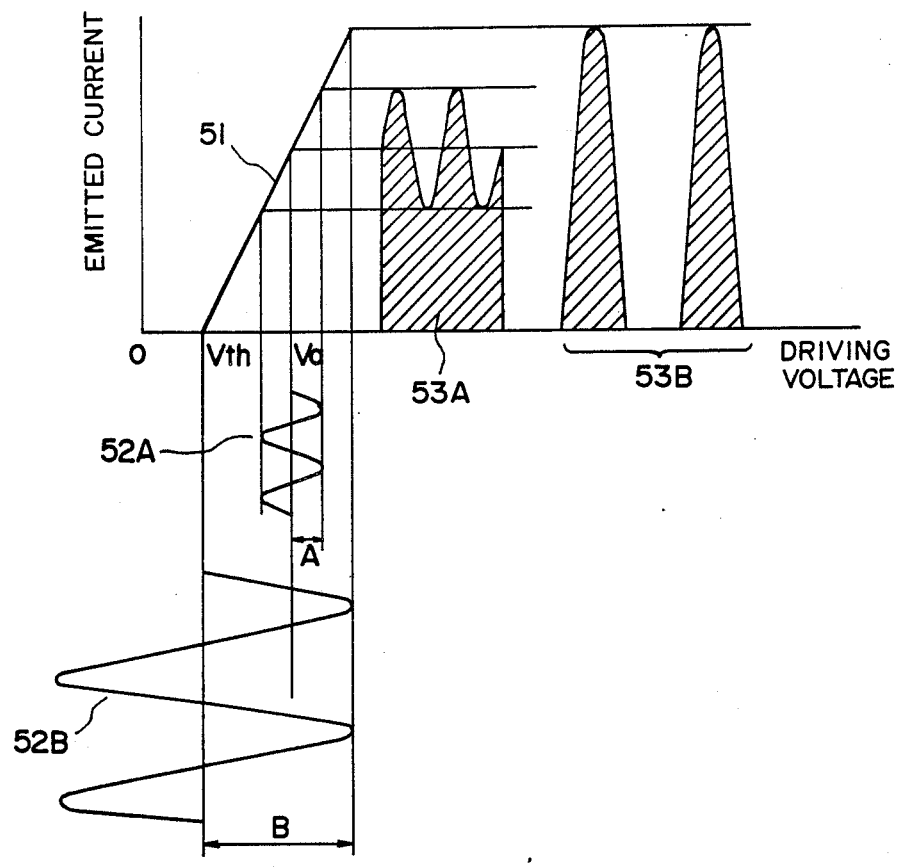
FIG. 5 is a graph showing the relation between a driving voltage applied to one electron emitting portion in the system of FIG. 1 and the emitted electric current.

FIG. 5 is a graph showing the relation between a driving electric voltage and an electric current emitted from one electron emitting portion, when the one electron emitting portion of the electron emitting device 1 is driven by the driving device 2.

In the graph of FIG. 5, reference numeral 51 denotes an electron emission characteristic curve. It is seen that, when the driving voltage is not greater than a threshold voltage Vth, substantially no electric current is emitted. When the driving voltage goes beyond the threshold Vth, the emitted current increases rectilinearly. Curve 52A depicts the state in which a sine wave (A·sin $2\pi f_1 t$) having an amplitude A is superposed upon a DC voltage Vo. The voltage Vo is higher than the threshold Vth, and the amplitude A satisfies the relation "2A<Vo-Vth". The sine wave of the amplitude A and the DC voltage Vo are supplied from the oscillator 2-1-3 and the low voltage source 2-1-2, respectively, shown in FIG. 3. Curve 53A depicts an electric current emitted when the driving voltage changes in accordance with the curve 52A. At this time, the change in the emitted current 53A corresponds to the change in the driving voltage 52A and is proportional to the gradient of the electron emission characteristic curve 51. By passing the emitted current 53A through the selecting device 4, such a variation component can be extracted and, therefore, the gradient of the electron emission characteristic curve 51 can be measured.

Curves 52B and 53B depict a driving voltage and an emitted electric current, respectively, on an occasion where a sine wave (B·sin $2\pi f_2 t$) having an amplitude B is superposed upon the DC voltage Vth. The emitted current 53B contains an odd harmonic content in addition to a fundamental component. Accordingly, when the operating point is set in this manner, the oscillation frequencies f1, f2, ... and fn should be set so that they are not in the relation of an odd-numbered multiple.

Figure 6:
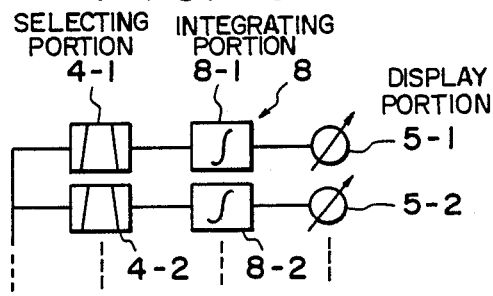
FIG. 6 is a schematic and diagrammatic view showing a portion of the structure of a measuring system according to another embodiment of the present invention, wherein an integrating means is provided.

FIG. 6 is a fragmentary view showing a portion of the structure of a measuring system according to another embodiment of the present invention. The remaining portion of the measuring system, not illustrated in FIG. 6, has substantially the same structure as of that shown in FIG. 1.

As shown in FIG. 6, the measuring system of the present embodiment includes integrating means 8 which is disposed between the selecting device 4 and the display device 5 and which is adapted to integrate, with time, the output of the selecting device 4, the integrated value being outputted to the display device 5. Such an integrating means 8 may be easily manufactured by using operational amplifiers. The addition of such an integrating means 8 allows measurement of the emitted current from the electron emitting device, in terms of an integrated value. This is analogous to the state of practical use when the electron emitting device is incorporated into a semiconductor microcircuit manufacturing exposure apparatus. Namely, since the integrated value obtained by the illustrated arrangement is equal to the amount of electric charges as applied to an electron-beam resist, the state of exposure (or the amount of exposure) of the electron-beam resist by the electron beam can be monitored by the measurement of the integrated value. Additionally, by comparing the integrated value with a preset value, it is possible to optimize the amount of exposure.

The measurement of emitted electric currents according to the concept of the present invention, described hereinbefore, provides various advantageous effects. Examples are as follows:

(1) It is possible to detect, promptly, the disorder or malfunction of an electron emitting element and, therefore, it is possible to prevent production of defective articles.

(2) It is possible to examine the dispersion or variance of electron emitting portions of an electron emitting device, and such examination can be made preparatorily. Thus, by setting an optimum operating point, it is possible to minimize the variation in the emitted electric currents.

(3) By measuring the integrated amount of the emitted electric current, the amount of exposure can be controlled at the optimum on an occasion where an electron emitting device is incorporated into an exposure apparatus.

While the invention has been described with reference to the structures disclosed herein, it is not confined to the details set forth and this application is intended to cover such modifications or changes as may come within the purposes of the improvements or the scope of the following claims.

What is claimed is:

1. A system for measuring characteristics of electron sources, said system comprising:
   driving means for driving said electron sources at predetermined frequencies so that each electron source emits an electron flow;
   collecting means for collecting the electron flows emitted from said electron sources;
   selecting means for selecting and extracting signals having components corresponding to said predetermined frequencies, out of the electron flows as collected by said collecting means; and
   measuring means for measuring an operation characteristic of an electron source responsive to the selection of, and corresponding to a signal selected by, said selecting means, independently from other electron sources.

2. A system according to claim 1, wherein said driving means is adapted to set variable frequencies to drive said electron sources.

3. A system according to claim 1, wherein said system is adapted to measure characteristics of electron sources of an electron emitting element of a type wherein emission of electrons from a cold cathode is used.

4. A system according to claim 1, wherein said output means includes integrating means for integrating the output of said selecting means.

5. A multi-electron-beam pattern apparatus, comprising:

a plurality of electron sources;

driving means for driving said electron sources at predetermined different frequencies so that each electron source emits an electron flow;

collecting means for collecting the electron flows emitted from said electron source;

selecting means for selecting and extracting signals having components corresponding to said predetermined frequencies, out of the electron flows as collected by said collecting means; and measuring means for measuring an operation characteristic of an electron source responsive to the selection of, and corresponding to a signal selected by, said selecting means, independently from other electron sources.

6. An apparatus according to claim 5, wherein said different frequencies are not in multiple relation.

7. An apparatus according to claim 5, wherein each of said electron sources comprises an electron emitting element of a type wherein emission of electrons from a cold cathode is used.

8. An apparatus according to claim 5, wherein said output means includes integrating means for integrating the output of said selecting means.

* * * * *

UNITED STATES PATENT AND TRADEMARK OFFICE
CERTIFICATE OF CORRECTION

PATENT NO. : 4,894,611

DATED : January 16, 1990

INVENTOR(S) : Isamu Shimoda, et al.

It is certified that error appears in the above-identified patent and that said Letters Patent is hereby corrected as shown below:

COLUMN 1

Line 29, "Sho54-111272" should read --Sho 54-111272--.

COLUMN 4

Line 8, "selecting device ," should read --selecting device 4,--.

COLUMN 8

Line 2, "electron source;" should read --electron sources;--.

Signed and Sealed this

Ninth Day of April, 1991

Attest:

HARRY F. MANBECK, JR.

*Attesting Officer*   *Commissioner of Patents and Trademarks*